March 28, 1961 I. A. LESK 2,977,256

SEMICONDUCTOR DEVICES AND METHODS OF MAKING SAME

Filed Aug. 16, 1956 2 Sheets-Sheet 1

INVENTOR:
ISRAEL A. LESK,
BY Julius J. Zaskalicky
HIS ATTORNEY.

SEMICONDUCTOR DEVICES AND METHODS OF MAKING SAME

Filed Aug. 16, 1956 2 Sheets-Sheet 2

INVENTOR:
ISRAEL A. LESK,

BY Julius J. Zaskalicky
HIS ATTORNEY.

2,977,256

SEMICONDUCTOR DEVICES AND METHODS OF MAKING SAME

Israel A. Lesk, Syracuse, N.Y., assignor to General Electric Company, a corporation of New York Filed Aug. 16, 1956, Ser. No. 604,527

10 Claims. (Cl. 148—1.5)

This invention relates to semiconductor devices of the junction type and to methods for making the same.

Various methods have been employed in the prior art in the fabrication of P-N junction semiconductor devices, including those commonly referred to as the "melt-back" and "diffusion" processes. The "melt-back" process comprises growing a crystal of semiconductor material from a melt impregnated with donor and acceptor impurities, cutting the crystal into pellets, melting one end of each of the pellets and then allowing the melted end to recrystallize. If the dominant impurity in the grown crystal is selected to have an appreciably lower segregation coefficient than the other impurity and the initial proportions of these impurities are properly selected, the other impurity can be caused to dominate in the recrystallized portion of the melted pellet. Thus, by this process a pellet which initially is of one type conductivity can be partially converted over to another type conductivity to form a junction therein. Such a process and variations thereof are disclosed and described in an application by Robert N. Hall, Serial No. 516,637, filed June 20, 1955, now Patent No. 2,822,309, granted February 4, 1958, and assigned to the assignee of the present application.

The "diffusion" process in one form comprises depositing a P-type impurity on one side and an N-type impurity on an opposed side of a pellet of substantially pure or intrinsic semiconductor material, and then diffusing the impurities into the interior of the pellet. The temperature and the time of diffusion are controlled to cause diffusion of the impurities to predetermined depths, thereby forming a P-N junction in the pellet. Such a process and variations thereof, including the making of devices having a plurality of junctions, are disclosed and described in an application by Robert N. Hall, Serial No. 187,478, filed September 29, 1950, and assigned to the assignee of the present invention.

In another form of the "diffusion" process, P-type and N-type impurities are diffused simultaneously or in sequence from the same side of a body of P or N-type conductivity semiconductive material. The conductivity type of the body and the diffusion constants and surface concentrations of the impurities are selected, and the time of diffusion and temperature are arranged so that part of the body having an initial conductivity type is converted into the opposite type and in turn a portion of the converted part is reconverted to the initial conductivity type. Thus a device is produced having regions of one conductivity type separated by a thin region of the opposite conductivity type. The regions of one conductivity type may be the emitter and collector and the region of opposite conductivity type may be the base of a transistor.

The "diffusion" process makes possible the obtaining of thin base regions with excellent control. However, inherent in the diffusion process are problems of reproducibility caused by the need for supplying impurities on the surface of semiconductive bodies in a given ratio and at a given concentration and maintaining such conditions through the high temperature diffusion cycle in which evaporation, oxidation, and other such effects are prevalent. The melt-back" process offers the advantage of simplicity and freedom from surface effects. However, it is difficult to reproducibly obtain a very thin base region using the "melt-back" process.

Accordingly, it is an object of this invention to provide a new and improved method for making semiconductor devices which retains the advantages of prior art methods while minimizing the disadvantages of such prior methods.

An important object of the invention is to provide a new and versatile method for producing, with excellent control and reliability, P-N junction semiconductor units having practically any desired combination of electrical characteristics in the various regions thereof.

Another object of this invention is to provide a simple method for reproducibly making semiconductor junction devices.

A further object of this invention is to provide a new and improved method of making transistor devices having thin base regions.

Still a further object of this invention is to provide a new method for fabricating transistor devices in which the resistivity is controlled in all regions.

Another object of this invention is to provide a new and improved method of making transistor devices which is readily adaptable for use with available fabricating equipment.

In carrying out the present invention in one illustrative form thereof, a body of semiconductor material is formed impregnated with acceptor and donor impurities or activators and with one or the other impurity predominating. A portion of the body is melted and allowed to recrystallize slowly. The activators are chosen with regard to segregation coefficients and amounts thereof such that after the melting operation, the conductivity type of the recrystallized body remains the same as the unmelted portion of the body. Also, under the aforementioned conditions, the level of concentration of both activators is considerably less at the interface between unmelted and recrystallized portions than in the unmelted portion of the body and increases with distance from the interface due to segregation during refreezing. An additional requirement on the impurities is that the non-dominant impurity diffuse faster than the dominant impurity. The body is then heated to a temperature and for a time to cause diffusion of the impurities in the body from the region of high impurity concentration level at the interface to regions of low impurity concentration level. This diffusion of impurities causes a conversion of the recrystallized region in the vicinity of the interface into a conductivity type corresponding to the impurity which was not dominant in the original body, but now because of its faster diffusion rate becomes dominant in this region. At portions of the recrystallized region farther removed from the interface the original conductivity type is maintained, the diffusion time being controlled to control the amount of the recrystallized region that is converted. Thus, the control available by the use of the diffusion process and the simplicity and freedom from surface effects of the melt-back process are combined in one simple process.

These and other advantages of this invention will be more clearly understood from the following description taken in connection with the accompanying drawings, and its scope will be apparent from the appended claims.

Figure 1:
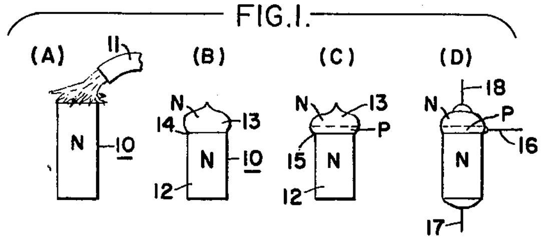
Figures 1A, 1B, 1C and 1D are sketches of one type of transistor device in successive steps of preparation in accordance with the present invention.

Figures 3, 4, 5, 6 and 7 each show another illustrative embodiment of a device made in accordance with the present invention and also show corresponding graphs of impurity concentrations versus distance at various steps in the process for making such devices.

In accordance with this invention, a monocrystalline semiconductor body is prepared with both acceptor and donor activator elements therein in relative quantities such that one type of activator element predominates to produce an overall characteristic of one conductivity type in said body. The activator elements are chosen to have segregation coefficients such that melting and recrystallizing one portion of the body does not cause a change in conductivity type in the recrystallized portion.

The segregation coefficient is defined as the ratio of impurity content assimilated by a growing ingot to the impurity content in liquid in contact with the growing ingot. In equation form, $$k=\frac{C_s}{C_l} \tag{1}$$

where:

$k$=segregation coefficient,
$C_s$=impurity concentration in solid (weight of impurity per weight of solid),
$C_l$=impurity concentration in liquid (weight of impurity per weight of liquid).

In a grown crystal, the impurity concentrations would be as follows:

$$N_D=k_DC_{DM} \tag{2}$$

where:

$N_D$=donor activator concentration in the solid,
$k_D$=segregation coefficient of donor activator,
$C_{DM}$=donor activator concentration in the melt, and $$N_A=k_AC_{AM} \tag{3}$$

where:

$N_A$=acceptor activator concentration in the solid,
$k_A$=segregation coefficient of acceptor activator,
$C_{AM}$=acceptor activator concentration in the melt.

Both activator concentration in solid (N) and activator concentration in melt (C) change as the crystal is growing. In a crystal which has been melted back, the impurity concentrations of donor and acceptor activators in the melted portion are given by Equations 2 and 3. However, when the melted portion is recrystallized, the concentrations in the recrystallized region would initially be, $$N'_D=k_D^2C_{DM} \tag{4}$$

and $$N'_A=k_A^2C_{AM} \tag{5}$$

The concentration of each impurity gets increasingly larger with distance from the initial solid-liquid interface as the crystal grows due to the fact that a smaller amount of impurity is assimilated initially leaving the melt with an increasingly heavier concentration. To satisfy one of the requirements of this invention, the requirement that the recrystallized portion of the body retain its original conductivity type, it is essential for dominant N-type conductivity that the following condition be fulfilled:

$$M_Dk_D^2C_{DM}>M_Ak_A^2C_{AM} \tag{6}$$

and for dominant P-type conductivity, $$M_Ak_A^2C_{AM}>M_Dk_D^2C_{DM} \tag{7}$$

where:

$M_D$=atoms/gram of donor activator
$M_A$=atoms/gram of acceptor activator

For the original crystal to be N-type, $$M_Dk_DC_{DM}>M_Ak_AC_{AM}$$

and if it is to be P-type, $$M_Ak_AC_{AM}>M_Dk_DC_{DM}$$

Thus, the relative quantities of the activators in the original crystal and their respective segregation coefficients, determine which impurities may be used.

A portion of the semiconductor body is melted. The body is then allowed to cool and recrystallize. Due to the difference in segregation coefficients of the donor and acceptor activators, and the relative quantities of these activators in the melted region as set forth in Equations 6 and 7, the recrystallizing portion contains more of the dominant activator element than it does of the non-dominant activator element. Consequently, the recrystallized portion assumes a conductivity type corresponding to the conductivity type produced by the dominant activator element.

The non-dominant activator element is so chosen that it has a higher diffusion coefficient than the dominant activator element.

The diffusion coefficient is a measure of how far impurities move by the diffusion process in a given length of time. That is, suppose a body is comprised of two regions, one having a high impurity concentration, the other a low impurity concentration. If the impurity has a high diffusion coefficient, more impurity will be transferred from the high concentration region to the low concentration region in a given time than if the impurity has a low diffusion coefficient, i.e., the amount of diffusion is greater for the impurity having the larger diffusion coefficient.

The body of semiconductor material is then heated to allow diffusion of the activator elements in the body of semiconductor material. Since the non-dominant activator diffuses more rapidly than the dominant activator, a zone of opposite conductivity type is formed by diffusion of the minority activator elements into the semiconductor body between zones of opposite conductivity type formed by the dominant activator which does not diffuse as rapidly as the minority activator. Thus, a pair of P-N junctions are formed intermediate zones of original conductivity type and the converted zone of opposite conductivity type.

The absolute amounts of activator impurities which may be used in practicing this invention are not critical. This method is operative from the smallest measurable additions up to the maximum solid solubilities of the various elements in germanium and silicon. The particular absolute amounts of activator impurities used are a matter of design consideration and are governed by the conductivities desired in the resultant P-N junction devices.

As a practical matter, the absolute amounts of acceptor and donor impurities are chosen to comply with the requirements set up by Equations 6 and 7. The levels or concentrations of impurities thus existing in the original crystal before the melt-back step depend on the concentrations of these impurities initially grown in the crystal. This impurity level determines the resistivity in all regions of the crystal. Consequently, the absolute amounts of impurities are selected to produce the most desirable resistivities. For example, an impurity concentration of approximately $10^{18}$ atoms/cm.$^3$ providing a resistivity on the order of .01 ohm-centimeter would be suitable for the emitter region of a transistor device. It will be appreciated that the particular resistivity in a given region also depends on whether N or P-type germanium or silicon is used. Impurity concentrations may vary in the emitter region from $10^{21}$ to $10^{15}$ atoms/cm.$^3$ corresponding approximately to a resistivity range of .001–5 ohm-centimeters to produce a usable transistor device. The resistivity in other regions of the device depend on the segregation and diffusion coefficients of the impurities. Impurity concentrations may vary between $10^{18}$–$10^{14}$ atoms/cm.$^3$ corresponding to a resistivity range of approximately .01–100 ohm-centimeters in the base and collector regions to provide desirable resistivities in these regions. Even higher concentrations may be used depending upon the impurity concentration gradient of the base-collector junction.

Referring now to Figure 1A, a bar 10 of semiconductor material such as silicon or germanium is shown before a junction is formed therein. Bar 10 contains both acceptor impurity material and donor impurity material substantially uniformly distributed therein. In this case the donor activator material which furnishes the semiconductor with an excess of free electrons predominates to provide the entire bar with N-type conductivity. The acceptor activator which furnishes positive holes to the semiconductor would normally impart P-type conductivity to the bar 10 except for the fact that more donor than acceptor activators are present.

Such a bar may be extracted from a monocrystalline ingot grown by withdrawing a seed crystal under prescribed conditions well-known in the art from a melt of semiconductor material containing both donor and acceptor impurities. Such techniques for growing suitable ingots are well-known in the art and are commonly referred to as the Czochralski technique.

While various activator impurities may be selected, it is important that the dominant type activator, which in this case is a donor activator, be added to the melt in an amount such that as a crystal of semiconductor material is grown from the melt, a relatively larger amount of donor activator material is assimilated in the growing crystal than of acceptor activator material.

As is shown in Figure 1A, the upper end of bar 10 is heated by torch 11 until the end is melted. Various means may be used for melting the end of the bar, the only requirement being that a temperature gradient exist in the semiconductor body 10 such that a portion of the body is heated to a high enough temperature to produce melting while the other portion remains solid. It is preferable that the heating process be carried on in an atmosphere of inert gas, or reducing atmosphere, or in a vacuum in order to avoid oxidation.

Figure 1B shows the result of melting the end of bar 10. A portion 13 is formed on one end of bar 10 which adheres to the unmelted portion 12. The melted portion 13 grows from the interface 14 between the solid portion 12 and the liquid portion 13. Since the loss of heat from the melted portion 13 to the solid portion 12 is inherently greater than the loss to the surrounding atmosphere, no special means are required to maintain the temperature differential required for directional cooling. The portion 12 is substantially unaffected by the heating process and retains its N-type conductivity. There will be a small amount of diffusion during the re-solidification process. This may be taken into account and constitute part of the total diffusion to which the bar is subjected, or if extremely thin bases are required, may be enough total diffusion. The melted portion 13 which is recrystallized also retains N-type conductivity because the donor and acceptor impurities were properly selected, both with regard to concentrations and segregation coefficients as previously explained. Consequently, more of the donor impurity is assimilated near the interface 14 than the acceptor impurity. Generally, the concentrations of impurities become increasingly greater as the molten portion 13 crystallizes from the interface to the outer end of portion 13. In fact, in this area appreciably removed from the interface a P-N junction may be formed due to a reversal of impurity concentration in which the acceptor impurity predominates. In many cases, such a junction is not useful because of its heavy impurity concentrations which may be so heavy as to render the semiconductive body metallic in character. In any case, this junction offers no serious problems, since it may be cut off, or ohmic contacts may be alloyed right through it.

The segregation coefficients of various activators are generally small. The amounts of donor and acceptor activators within the recrystallized portion 13 are a factor of $k$ times than those in the unmelted portion 12, and consequently are much smaller than the concentrations in unmelted portion 12. However, the conductivity which the semiconductor exhibits does not depend only upon the amounts of the impurities present but upon an excess of one type activator over another type. Therefore, semiconductor bar 10 remains predominately N-type throughout with a smaller number of N-type activators in recrystallized region 13 near the interface 14 than exist in the bar 12.

The semiconductor 10 is then reheated below its melting point to produce the device shown in Figure 1C. Since the donor activator and acceptor activators are chosen in this example such that the acceptor activator diffuses more rapidly when heated than the donor, the acceptor impurity diffuses into the region 13 from the region 12 faster than does the donor impurity. The amount of diffusion is controlled by the temperature and time employed for effecting the diffusion. In this particular instance heat is applied until the acceptor activator diffuses to cause predominance of acceptor activator in this region with the result that a zone of opposite conductivity type, i.e. P-type, is formed in an area of region 13 very close to the interface 14. Consequently, a P-type region 15 separates two N-type regions 12 and 13. As shown in Figure 1D, electrodes 17 and 18 are secured in ohmic, conductive relationship with N-type regions 12 and 13, i.e., by soldering. Electrode 16 is ohmically secured to the P-type region 15 which forms the base of the N-P-N type transistor.

Figure 2:
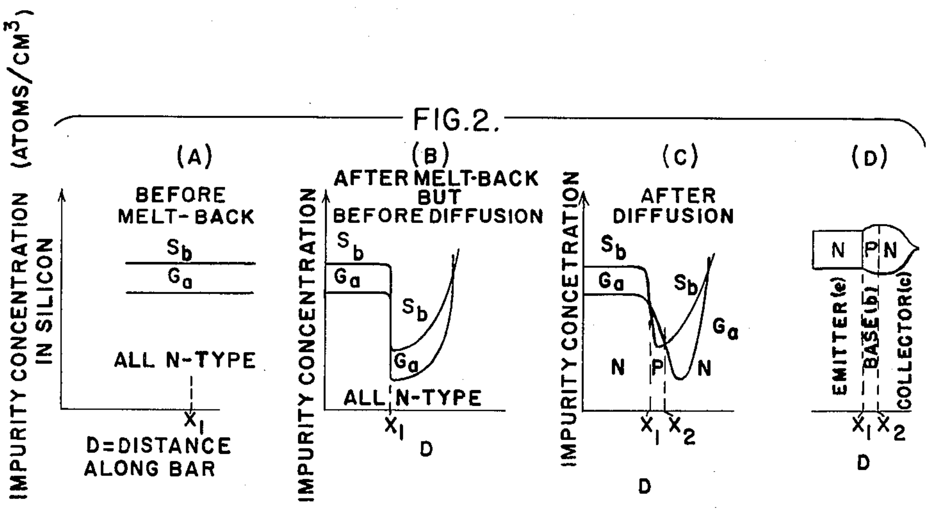
Figures 2A, 2B and 2C are graphical representations of impurity concentration in a bar or pellet of semiconductor material as a function of distance along the bar at various steps in the process in accordance with the present invention for making one type of semiconductor device illustrated in Figure 2D.

As an illustrative example, the N-P-N type transistor of Figure 1 may be formed by the use of silicon in combination with the acceptor impurity material gallium and the donor impurity material antimony. Figures 2A, 2B and 2C show a series of graphs of impurity concentration of these activators as a function of distance along a silicon bar at various steps of the process described in connection with Figure 1. In Figure 2A, the relative concentrations of antimony and gallium are shown before the melt-back step is accomplished. There is a predominance of antimony or donor activator providing the bar 10 with an N-type conductivity. An end portion of bar 10 is then melted back and slowly allowed to be recrystallized producing the impurity distribution shown in the graphs of Figure 2B. It should be noted that a predominance of antimony exists throughout the length of the bar. The steep downward slope in the graphs of Figure 2B at the point labelled $x_1$ represents the liquid-solid interface of the bar or the point to which bar 10 was melted back. Since the amount of antimony assimilated in the growing crystal is greater than that of the gallium, the bar remains of N-type conductivity. In Figure 2C, the impurity distribution is then shown after the diffusion step.

During the diffusion cycle, which consists of heating the bar to an elevated temperature for a period of time, both the gallium and antimony diffuse. That is, some gallium and antimony move from the higher concentration region at the left of the interface $x_1$ to the lower concentration region at the right of interface $x_1$. Since the diffusion coefficient of gallium in silicon is greater than that of antimony, a greater portion of the gallium than of antimony migrates to the low concentration region from the high concentration region. This results in a predominance of gallium or acceptor-type impurity in the region designated approximately by $x_1$—$x_2$ in the vicinity of the interface region. Thus, two N-type regions are separated by a P-type region in the vicinity of the interface. Consequently, the N-P-N type transistor shown in Figure 2D is formed, in which the unmelted portion constitutes the emitter and the unconverted recrystallized portion constitutes the collector and the in-between region of opposite conductivity constitutes the base, having a thin P-type base region which may be controlled by the time and temperature of the diffusion cycle, as well as by the amounts and types of impurities chosen.

(A) As one specific example of the embodiment shown in Figures 2A, 2B, 2C and 2D, an N-P-N type transistor having a thin P-type base region is made by preparing a melt consisting of 30 grams of silicon with a residual impurity concentration of less than or approximately equal to $10^{15}$ atoms per cubic centimeter, and 150 milligrams of antimony and 74 milligrams of gallium. A monocrystalline ingot is grown from the melt by the well-known seed crystal withdrawal technique generally known as the Czochralski technique. The crystal is grown at a rate of one inch per hour, and the crystal is rotated at 60 r.p.m. to insure good stirring of the impurities. The concentrations of antimony and gallium in the grown crystal were approximated to be $2\times10^{18}$ atoms per cubic centimeter (corresponding to a resistivity of .05 ohm-centimeter) and $4\times10^{17}$ atoms per cubic centimeter, respectively. These figures are for regions at the first grown portion of the crystal. Both concentrations increase down the crystal according to well known segregation effects. However, their ratio remains approximately the same. The crystal is cut into pellets of approximate dimensions of .25 inch long and .03 x .03 inch in cross-section. One end of the pellet is positioned next to a hot tungsten filament and is melted by the filament in a hydrogen atmosphere. Power is slowly reduced to cool the bar slowly (allowing the bar to refreeze in about ten seconds). The bar was then etched clean with, i.e., a hydrofluoric-nitric acid mixture ($HF:HNO_3\approx1:4$) and then heated to 1200° C. for about two hours. It was found necessary to cool slowly (a matter of hours) after diffusion in many cases to maintain good minority carrier lifetime in the silicon in the P-type base and adjoining areas of the N-type regions. An N-P-N type transistor was thus formed having a base width of approximately .0001 inch. The net impurity concentration in the collector and base regions was approximately $6\times10^{16}$ atoms per cubic centimeter corresponding to resistivities of about .4 and .2 ohm-centimeter for the base and collector regions, respectively. The precise shapes of impurity concentrations could be easily computed from equations well-known in the art.

It will be appreciated that other combinations of activators may be utilized to produce transistors by the method of this invention as long as two conditions are met. The first condition requires that after the melt-back step, the initial conductivity of the bar remains the same. The second condition is that the less dominant activator have a larger diffusion coefficient than that of the dominant activator (which determines the initial conductivity type for the semi-conductor) at temperatures at which diffusion is performed. Some other combinations of donor and acceptor impurities for forming N-P-N type transistors in silicon are, i.e., antimony-indium, antimony-boron, antimony-aluminum, gallium-arsenic, phosphorous-aluminum, phosphorous-gallium, arsenic-boron, arsenic-boron, arsenic- indium, and arsenic-aluminum.

P-N-P type transistors may also be formed by this method by the proper selection of semiconductor material, donor activator and acceptor activator with reference to the two criteria mentioned above.

(B) As a specific example of the P-N-P type transistor made in accordance with this invention, a melt is prepared consisting of 100 grams of germanium, 1.45 milligrams of gallium and 34 milligrams of antimony. The crystal is grown in accordance with the seed crystal method as set forth in the previous example and cut into pellets as before. The net acceptor concentration in the crystal is approximately $7\times10^{16}$ atoms per cubic centimeter, corresponding to a resistivity of .08 ohm-centimeter. Diffusion is performed at 800° C. for approximately two hours. The resulting P-N-P type transistor has a base width of approximately .0002 inch. The net acceptor concentration in the collector region is $7\times10^{15}$ atoms per cubic centimeter corresponding to a resistivity of .5 ohm-centimeter and the net donor concentration in the base region is $10^{16}$ atoms per cubic centimeter corresponding to a resistivity of .2 ohm-centimeter. In many cases involving germanium, it was found necessary to anneal at about 500° C. for periods ranging from several hours to several days in order to remove copper and other undesired impurities which had converted the base region to P-type, thus in effect shorting the transistor. However, the removal of these impurities is not considered serious and may be easily accomplished by the annealing step. These undesired impurities may be prevented from entering the bar during diffusion by first coating the bar with a "scavenging" material such as gold. This must then be etched off after the diffusion cycle.

Various other combinations of impurities may be utilized to produce P-N-P structures. The requirement here is that the acceptor activator remain predominant after melt-back and that the donor activator diffuse faster than the acceptor activator. Examples of other combinations suitable for producing P-N-P structures in germanium are gallium-arsenic, gallium-phosphorous, indium-arsenic, indium-antimony, and indium-phosphorous.

Figure 3:
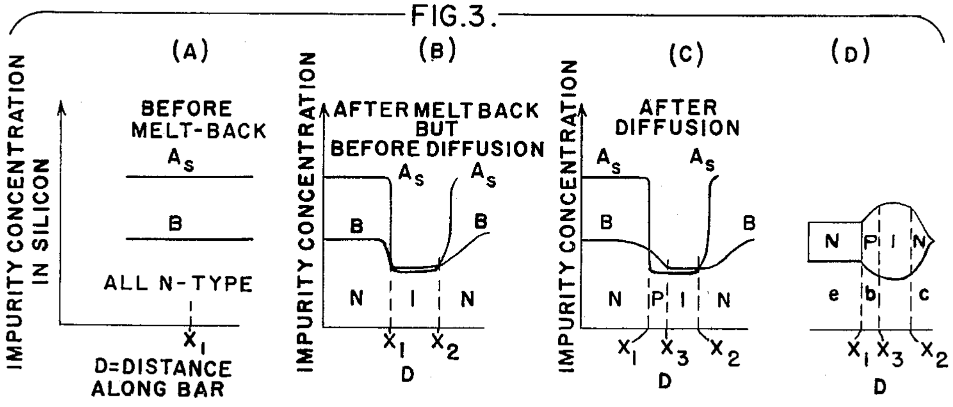

The resistivity distribution in the collector regions of bars made in accordance with this invention depends on the speed of recrystallization after the melt-back process. If freezing takes place slowly and then quickly, a region of high resistivity may be deposited at the beginning of the refreezing cycle. This region of high resistivity may be close to being an intrinsic region in which the donors and acceptors appear in substantially equal numbers. Low resistivity material is deposited during quick freezing due to rate growing, stirring, and quencing effects. Figure 3 shows a graphic representation of how an intrinsic region is formed by this method in a transistor device. Initially, as shown in Figure 3A, the bar of silicon is all N-type, since it contains a predominance of the donor impurity arsenic over that of the acceptor impurity, boron. The amounts of arsenic and boron are so chosen that during the slow part of the recrystallization cycle they are present in almost equal amounts. Hence, a nearly intrinsic region is formed near the interface $x_1$ by slowly refreezing the pellet in this region. The so-called N-I-N type bar (where "I" in this case refers to a region of high resistivity) is produced. This impurity distribution is shown in Figure 3B. The I-type region exists in the bar between points $x_1$ and $x_2$. The bar is heated, and since boron diffuses more rapidly in silicon than does arsenic, a thin P-type region is deposited at the interface to form an N-P-I-N type bar. This distribution is shown in Figure 3C. The P-type region extends approximately from point $x_1$ to $x_3$ and the I-type region extends from point $x_3$ to $x_2$. It can be seen that the "I" region can be made either P-type or N-type, according to whether there is a slight predominance of acceptor or donor activator atoms. The I-region is beneficial in extending collector voltage and frequency response of transistors. The N-P-I-N type bar so formed is shown in Figure 3D. The unmelted N-type region may be the emitter, the melted and recrystallized N-type region may be the collector and the P-type region may be the base of a transistor device.

As a specific example of a device formed in accordance with the embodiment of Figure 3, a melt is prepared consisting of 30 grams of silicon, .15 milligram of arsenic, and $3\times10^{-3}$ milligrams of boron. A transistor is then formed following the same procedure of crystal formation, melt-back, recrystallization and diffusion as has been previously set forth in connection with the N-P-N type device of Figure 2. In recrystallization, the bar is allowed to recrystallize slowly for a time to produce the I-type region of high resistivity and then more rapidly to produce the region of N-type conductivity. The resulting N-P-I-N transistor device, shown in Figure 3D, has emitter and collector region resistivities of approximately .4 ohm-centimeter, an I-type region resistivity of approximately 100 ohm-centimeters, and a base region resistivity of approximately 3 ohm-centimeters.

Various combinations of impurities may be used to obtain a transistor with an I-region according to this embodiment. For example, to obtain an N-P-I-N type bar in silicon, antimony-boron and phosphorous-boron may be used.

Figure 4:
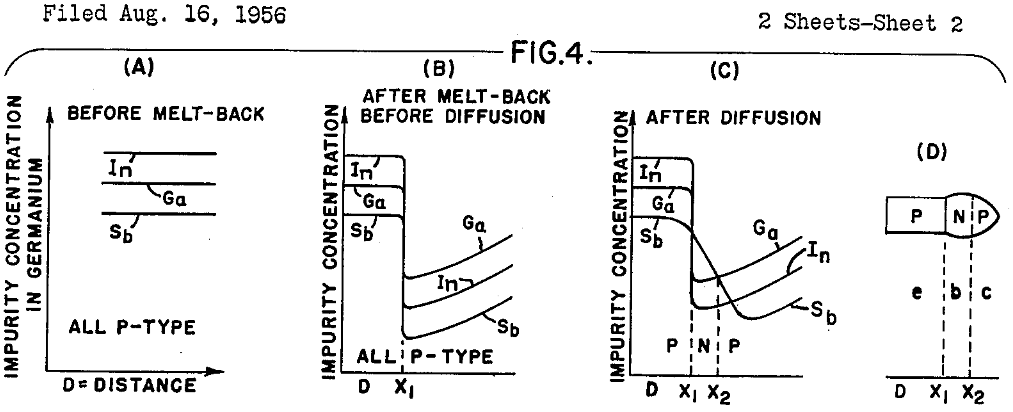

Up to this point, the invention has been described with reference to the addition of two impurity activators to the semiconductor material. However, the invention is not restricted to the use of two activators as a larger number of activators may be utilized to produce other advantageous results. Figure 4 shows a distribution of impurities in the semiconductor in which three impurities are utilized. Indium and gallium are used as acceptor impurities and antimony is utilized as a donor impurity in germanium. The relative quantities of indium, gallium and antimony in the crystal are shown in Figure 4A before the melt-back step. Since indium predominates throughout the bar, the bar is of P-type conductivity. After the melt-back step, but before the diffusion step, gallium predominates in the recrystallized region due to the fact that it has a higher segregation coefficient in germanium than does indium. However, since gallium is an acceptor impurity, the bar still remains dominantly P-type throughout with the indium dominating in one region and the gallium dominating in the resolidified region. This distribution of impurities is shown in Figure 4B. The bar is then heated to allow diffusion of the impurities providing the distribution of impurities shown in Figure 4C. Since antimony diffuses faster in germanium than either gallium or indium, it will diffuse and predominate to form an N-type base region of approximate extent $x_1$—$x_2$ in the proximity of the interface $x_1$. Accordingly, the P-N-P type transistor shown in Figure 4D is formed. The particular advantage of this embodiment resides in the fact that the resistivity in the emitter region is controlled or determined by the dominant activator which in this case is indium. On the other hand, the resistivity in the collector region is determined by gallium. Consequently, the resistivity in the emitter and collector regions are independently determined by two different activators. This provides a better control on the resistivities in these regions.

As a specific example of the embodiment described in connection with Figure 4, a P-N-P type transistor is made by preparing a melt consisting of 100 grams of germanium, 712 milligrams of indium, .87 milligram of gallium and 50 milligrams of antimony. A monocrystalline ingot is grown in the manner previously described. Pellets are cut from the ingot and are melted back by using a hot tungsten filament in a hydrogen atmosphere. The pellet is then heated to 800° C. for approximately 2 hours to allow the impurities to diffuse. The resulting P-N-P type device has a base width of approximately .0001 inch. The net acceptor concentration in the emitter region is $2\times10^{17}$ atoms per cubic centimeter corresponding to a resistivity of approximately .05 ohm-centimeter. The net donor concentration in the base region is about $10^{16}$ atoms/cm.$^3$ corresponding to a resistivity of .2 ohm-centimeter, and the net acceptor concentration in the collector region is $4\times10^{15}$ atoms/cm.$^3$ corresponding to a resistivity of 1 ohm-centimeter.

Other combinations of impurities may also be used to produce P-N-P type transistors in germanium, in accordance with this last embodiment. Two conditions must be met, the first condition being that one acceptor activator predominate before melt-back and after melt-back another acceptor activator predominates, giving the bar a dominant P-type conductivity after the melt-back process. The other condition is that the donor activator diffuse faster than either of the acceptor activators. Examples of combinations suitable to form such devices in germanium are indium - gallium - arsenic, indium - gallium - phosphorous. N-P-N structures may also be fabricated according to this embodiment, i.e., the following impurities may be used in silicon to produce N-P-N type structures: antimony-arsenic-gallium, phosphorous-antimony-gallium, arsenic-antimony-aluminum, and phosphorous-antimony-aluminum.

Three impurities may also be used to produce N-P-I-N type devices. Figure 5A shows a bar of silicon to be N-type because of a predominance of antimony, the donor activator. The bar also contains the acceptor activators gallium and boron. The boron is used to produce the I-region by compensating for the antimony after the melt-back step. This will be apparent by reference to the impurities distribution curves of Figure 5B. Boron has a segregational coefficient slightly below unity in silicon and will assimilate almost independent of distance in the growing ingot near the interface $x_1$ to compensate for the antimony appearing in the $x_1$—$x_2$ region. After a small I-region, antimony again greatly predominates, if the growth rate is suddenly increased to produce an N-type region, thus forming an N-I-N type bar. Upon heating the bar, gallium diffusing more rapidly than antimony near the interface $x_1$ forms the P-region of approximate extent $x_1$—$x_3$, thus producing an N-P-I-N type device, having the I region of high resistivity between the P-type base and the N-type collector electrode. Figure 5C shows the impurity distribution after diffusion, and Figure 5D shows the device produced by such a distribution of impurities.

Figure 5:
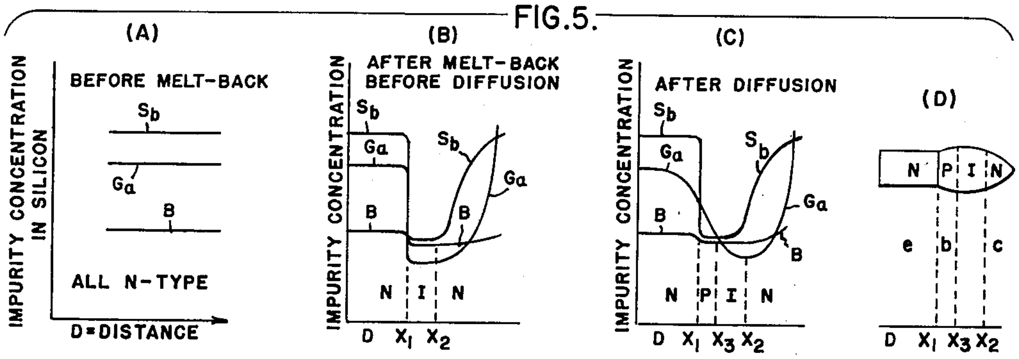

As a specific example of a device fabricated in accordance with the embodiment of Figure 5, a melt is prepared consisting of 30 grams of silicon, 15 milligrams of antimony, 7.4 milligrams of gallium, and $1.8\times10^{-3}$ milligrams of boron. A semiconductor device is then formed following the same procedure of crystal formation, melt-back, recrystallization and diffusion as has been previously set forth in connection with other examples using silicon as the semiconductor material. The resulting N-P-I-N type device, shown in Figure 5D, has emitter and collector region resistivities of approximately .1 ohm-centimeter, an I-type region resistivity of approximately 30 ohm-centimeters, and a base resistivity of approximately 2 ohm-centimeters.

Figures 6A, 6B and 6C show a method of making the transistor device, shown in Figure 6D, using three impurities, antimony, gallium and gold. Gold was chosen to be used in silicon, since gold diffuses much faster than other impurities in silicon. As shown in Figure 6A, the original bar contains antimony, gallium and gold. Since there is a predominance of antimony, the bar appears all N-type. In Figure 6B, after the melt-back step, the bar still remains dominantly N-type throughout. On heating, the impurities are redistributed in accordance with the curves of Figure 6C. The gallium which exists in greater quantity than the gold diffuses near the interface $x_1$ to form a P-region of approximate extent $x_1$—$x_2$. The next region $x_2$—$x_3$ has a predominance of gold which has diffused quite rapidly to exceed the antimony appearing in this region to form an intrinsic or I-region. In the next region, antimony again predominates, thus forming the N-P-I-N type transistor shown in Figure 6D.

Figure 6:
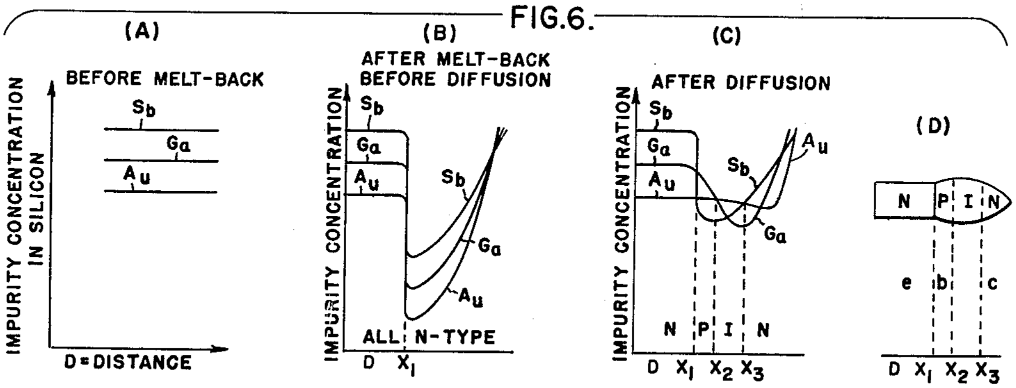

As a specific example of a device fabricated in accordance with the embodiment of Figure 6, a melt is prepared consisting of 30 grams of silicon, 15 milligrams of antimony, 7.4 milligrams of gallium and 1.35 grams of gold. The device is then formed following the same procedure of crystal formation, melt-back, recrystallization and diffusion as has been previously set forth in connection with other examples using silicon as the semiconductor material. The resulting N-P-I-N type device, shown in Figure 6D, has emitter and collector region resistivities of approximately .1 ohm-centimeter, an I-type region resistivity of approximately 50 ohm-centimeters or greater and a base region resistivity of approximately 2 ohm-centimeters.

Another alternative method of combining the melt-back and diffusion processes consists of impregnating a crystal with one impurity such that the pellet is either N-type or P-type. A pellet from the crystal is then melted back and recrystallized. The resulting pellet has a conductivity type of either P-type or N-type, the concentration varying as shown in Figure 7A. A fast diffusing impurity of opposite conductivity type is then diffused throughout the sample, its concentration being controlled so that it predominates in only the low concentration region, i.e. the base region. Figure 7A and 7B shows curves of the impurity concentration versus distance along the semiconductor pellet according to this last embodiment. In Figure 7A before diffusion, an N-type impurity predominates throughout the length of the bar. The concentration, however, is not as strong near the interface $x_1$ produced by melt-back and refreezing. A P-type impurity is deposited along the pellet, heated and diffused therein throughout the pellet. The resulting impurity distribution is shown in Figure 7B. The temperature which controls solid solubility may be used to control the concentration of the second impurity, or a controlled surface concentration of the second impurity may be used. The concentration is controlled such that a P-type impurity predominates only in the base region $x_1$—$x_2$, thus forming the N-P-N type transistor shown in Figure 7C. During diffusion of the second impurity, there is a small diffusion of the first impurity which may effect somewhat the impurity concentration gradient of the P-N junctions.

Figure 7:
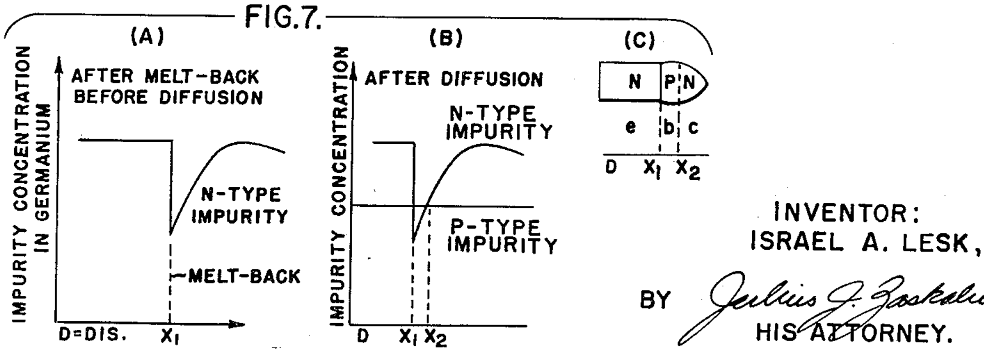

As a specific example of a device formed in accordance with the embodiment of Figure 7, a melt is prepared consisting of 100 grams of germanium and 500 milligrams of antimony. The device before diffusion is formed following the same procedure of crystal formation, melt-back, and recrystallization as has been set forth in detail in connection with other examples. Diffusion is then performed by coating the germanium pellet with a thin layer of copper and heating the bar at 800° C. for two hours. The resulting device, shown in Figure 7C, has emitter and collector region resistivities of approximately .01 ohm-centimeter and a base region resistivity of approximately .4 ohm-centimeter.

The bar of Figure 7 may also be predominately impregnated with the P-type impurity and after the melt-back process, an N-type impurity may be diffused into the bar to produce a P-N-P type transistor. As examples, antimony-copper and arsenic-gallium may be used with germanium for forming the N-P-N transistor, and aluminium-arsenic may be used with silicon to form a P-N-P transistor in accordance with this embodiment.

While this invention has been described with respect to obtaining initial impurity levels in a pellet by the seed crystal withdrawal technique, it will be obvious that other methods, i.e., diffusion, may be used for this purpose. It is also obvious that different combination of impurities may be used in various numerical combinations to produce devices in accordance with this invention.

Since other modifications varied to fit particular operating requirements and environments will be apparent to those skilled in the art, the invention is not considered limited to the examples chosen for purposes of disclosure and covers all changes and modifications which do not constitute departures from the true spirit and scope of this invention.

What I claim as new and desire to secure by Letters Patent of the United States is:

1. A method of producing a junction transistor from a monocrystalline semiconductor body having dispersed therein at least one activator element for producing dominant conduction carriers of one conductivity type therein and a second activator element for producing a smaller number of conduction carriers of the opposite conductivity type therein, which method comprises fusing a portion of said semiconductor body to produce a liquid-phase to solid-phase interface therein, refreezing said fused portion from said interface, said activators being of a kind, the ratio of the quantities thereof being of a magnitude, and the freezing thereof being at a rate whereby said fused and refrozen portion in the region thereof adjacent said interface has smaller quantities of each of said activator elements and has said one conductivity type, the diffusion coefficient of said second activiator element being appreciably greater than the diffusion coefficient of said first activator element, the density of the said second activator element in said unmelted region of said body being greater than the density of said first activator element in said fused and refrozen region, heating said body for a time and temperature without melting said body to cause sufficient diffusion of said second activator element from said unmelted portion into said melted and refrozen region to produce dominant conduction carriers of said opposite conductivity type therein.

2. The method of claim 1 in which said semiconductor body is silicon, said one activator element is antimony and in which said second activator is gallium.

3. A method of producing a junction transistor from a monocrystalline semiconductor body having dispersed therein at least one activator element for producing dominant conduction carriers of one conductivity type therein and a second activator element for producing a smaller number of conduction carriers of the opposite conductivity type therein, which method comprises fusing a portion of said semiconductor body to produce a liquid-phase to solid-phase interface therein, refreezing said fused portion from said interface, said activators being of a kind, the ratio of the quantities thereof being of a magnitude, and the freezing thereof being initially at a slow rate and thereafter at a fast rate whereby said fused and refrozen portion in the region thereof adjacent said interface has smaller quantities of each of said activator elements than said unmelted portion and has its conductivity considerably reduced and in the region thereof remote from said interface has quantities of activator comparable to quantities in said unmelted portion and of said one conductivity type, the diffusion coefficient of said second activator element being appreciably greater than the diffusion coefficient of said first activator element, the density of the said second activator element in said unmelted region of said body being greater than the density of said first activator element in said fused and refrozen region adjacent said interface, heating said body for a time and temperature without melting said body to cause sufficient diffusion of said second activator element from said unmelted portion into said melted and refrozen region adjacent said interface to produce dominant conduction carriers of said opposite conductivity in a part thereof.

4. A method of producing a junction transistor from a monocrystalline silicon semiconductor body having dispersed therein at least one donor activator element for producing dominant conduction carriers of said one conductivity type therein and an acceptor activator element for producing a smaller number of conduction carriers of the opopsite conductivity type therein, which method comprises fusing a portion of said semiconductor body to produce a liquid-phase to solid-phase interface therein, refreezing said fused portion from said interface, said acceptor activator being boron, the ratio of the quantities thereof being of a magnitude, and the freezing thereof being initially at a slow rate and thereafter at a fast rate whereby said fused and refrozen portion in the region thereof adjacent said interface has smaller quantities of each of said activator elements than said unmelted portion and has essentially intrinsic conductivity and in the region thereof remote from said interface has quantities of activator comparable to quantities in said unmelted portion and of said one conductivity type, the diffusion coefficient of said second activator element being appreciably greater than the diffusion coefficient of said first activator element, the density of the said second activator element in said unmelted region of said body being greater than the density of said first activator element in said fused and refrozen region adjacent said interface, heating said body for a time and temperature without melting said body to cause sufficient diffusion of said second activator element from said unmelted portion into said melted and refrozen portion to produce dominant conduction carriers of said opposite conductivity type in that portion of said intrinsic region adjacent said interface.

5. A method of producing a junction transistor from a monocrystalline semiconductor body having dispersed therein a pair of activator elements for producing dominant conduction carriers of one conductivity type therein, one of said pair being included in such quantity as to be determinative of the conductivity thereof, and a third activator material for producing a smaller number of conduction carriers of the opposite conductivity type therein, which method comprises fusing a portion of said semiconductor body to produce a liquid-phase to solid-phase interface therein, refreezing said fused portion from said interface, said activators being of a kind, the ratios of the quantities thereof being of magnitudes, and the freezing thereof being at a rate whereby said fused and refrozen portion in the region of said interface has substantially smaller quantities of each of said activator elements and has said one conductivity type, the other of said pair having a segregation coefficient as to be determinative of the conductivity thereof, the diffusion coefficient of said third activator element being appreciably greater than the diffusion coefficient of each of said pair of said activator elements, the density of the said third activator element in said unmelted portion of said body being greater than the aggregate density of said pair of activator elements in said fused and refrozen region adjacent said interface, heating said body for a time and temperature without melting said body to cause sufficient diffusion of said second activator element from said unmelted portion into said melted and refrozen region adjacent said interface to produce dominant conduction carriers of said opposite conductivity type therein.

6. A method of producing a junction transistor from a monocrystalline germanium semiconductor body having dispersed therein first and second acceptor activator elements for producing dominant conduction carriers of one conductivity type therein, said first activator being determinative of the conductivity thereof, and a third activator donor element for producing a smaller number of conduction carriers of the opposite conductivity type therein, which method comprises fusing a portion of said semiconductor body to produce a liquid-phase to solid-phase interface therein, refreezing said fused portion from said interface, said first, second and third activators being indium, gallium and antimony, respectively, the ratios of the quantities thereof being of magnitudes, and the freezing thereof being at a rate whereby said fused and refrozen portion in the region of said interface has substantially smaller quantities of each of said activator elements and has said one conductivity type, said second activator element having a segregation coefficient as to be determinative of the conductivity thereof, the diffusion coefficient of said third activator element being appreciably greater than the diffusion coefficient of said first and second activator elements, the density of the said third activator element in said unmelted portion of said body being greater than the aggregate density of first and second activator elements in said fused and refrozen region adjacent said interface, heating said body for a time and temperature without melting said body to cause sufficient diffusion of said third activator element from said unmelted portion into said melted and refrozen region adjacent said interface to produce dominant conduction carriers of said opposite conductivity type therein.

7. A method of producing a junction transistor from a monocrystalline silicon semiconductor body having dispersed therein first and second donor activator elements for producing dominant conduction carriers of one conductivity type therein, said first activator element being determinative of the conductivity thereof, and a third acceptor activator element for producing a smaller number of conduction carriers of the opposite conductivity type therein, which method comprises fusing a portion of said semiconductor body to produce a liquid-phase to solid-phase interface therein, refreezing said fused portion from said interface, said first, second and third activators being selected from the group of combinations consisting of antimony-arsenic-gallium, phosphorus-antimony-gallium, arsenic-antimony-aluminum, and phosphorus-antimony-aluminum, the first, second and third named elements of each of said combinations corresponding respectively to said first, second and third activators, being of a kind, the ratios of the quantities thereof being of magnitudes, and the freezing thereof being at a rate whereby said fused and refrozen portion in the region of said interface has substantially smaller quantities of each of said activator elements and has said one conductivity type, said second activator element having a segregation coefficient as to be determinative of the conconductivity thereof, the diffusion coefficient of said third activator element being appreciably greater than the diffusion coefficient of said first and second activator elements, the density of the said third activator element in said unmelted portion of said body being greater than the aggregate density of said first and second activator elements in said fused and refrozen region adjacent said interface, heating said body for a time and temperature without melting said body to cause sufficient diffusion of said second activator element from said unmelted portion into said melted and refrozen region adjacent said interface to produce dominant conduction carriers of said opposite conductivity type therein.

8. A method of producing a junction transistor from a monocrystalline semiconductor body having dispersed therein an activator element for producing dominant conduction carriers of one conductivity type therein, and second and third activator elements producing a smaller number of conduction carriers of the opposite conductivity type therein, which method comprises fusing a portion of said semiconductor body to produce a liquid-phase to solid-phase interface therein, refreezing said fused portion from said interface, said activators being of a kind, the ratios of the quantities thereof being of magnitudes, and the freezing thereof being initially at a slow rate and thereafter at a fast rate whereby said fused and refrozen portion in the region thereof adjacent said interface has smaller quantities of said activator elements than in said unmelted portion and has a region immediately adjacent said interface of low conductivity followed by a region of high conductivity of said one conductivity type, the diffusion coefficient of said second activator being appreciably greater than the diffusion coefficient of said first activator, the aggregate density of said second and third activator elements in said unmelted portion of said body being greater than the density of said first activator element in said fused and refrozen region of low conductivity, heating said body for a time and temperature without melting said body to cause sufficient diffusion of said second activator element from said unmelted portion into said melted and refrozen region of low conductivity to produce dominant conduction carriers of said opposite conductivity type in a part thereof.

9. A method of producing a junction transistor from a monocrystalline silicon semiconductor body having dispersed therein an activator element for producing dominant conduction carriers of said one conductivity type therein, and second and third activator elements producing a smaller number of conduction carriers of the opposite conductivity type therein, which method comprises fusing a portion of said semiconductor body to produce a liquid-phase to solid-phase interface therein, refreezing said fused portion from said interface, said first, second and third activator elements being antimony, gallium and boron respectively, the ratios of the quantities thereof being of magnitudes, and the rate of freezing thereof being initially at a slow rate and thereafter at a fast rate whereby said fused and refrozen portion in the region thereof adjacent said interface has smaller quantities of said activator elements than in said unmelted portion and has a region immediately adjacent said interface of low conductivity followed by a region of high conductivity of said one conductivity type, the diffusion coefficient of said second activator being appreciably greater than the diffusion coefficient of said first activator, the aggregate density of said second and third activator elements in said unmelted portion of said body being greater than the density of said first activator element in said fused and refrozen region of low conductivity, heating said body for a time and temperature without melting said body to cause sufficient diffusion of said second activator element from said unmelted portion into said melted and refrozen region of low conductivity to produce dominant conduction carriers of said opposite conductivity type in a part thereof.

10. A method of producing a junction transistor from a monocrystalline silicon semiconductor body having dispersed therein a concentration of a donor activator element for producing dominant conduction carriers of one conductivity type and second and third activator elements for producing a smaller number of conduction carriers of the opposite conductivity type therein, said second activator being included in greater quantity than said third activator, which method comprises fusing a portion of said semiconductor body to produce a liquid-phase to solid-phase interface therein, refreezing said fused portion from said interface, said first, second and third activators being antimony, gallium and gold respectively, the ratio of the quantities thereof being of a magnitude, and the freezing thereof being at a rate whereby said fused and refrozen portion in the region adjacent said interface has substantially smaller quantities of said activator elements and has said one conductivity type, the diffusion coefficient of said second and third activator elements being appreciably greater than the diffusion coefficient of said first activator element, the diffusion coefficient of said third activator element being appreciably greater than the diffusion coefficient of said second activator element, the aggregate density of the said second and third activator elements in said unmelted portion of said body being greater than the density of said first activator element in said fused and refrozen portion in the vicinity of said interface, heating said body for a time and temperature without melting said body to cause sufficient diffusion of said second and third activator elements from said unmelted portion into said melted and refrozen portion to produce dominant conduction carriers of said opposite conductivity type in that portion of said fused and melted portions adjacent said interface and a region of low conductivity more remote therefrom.

References Cited in the file of this patent

UNITED STATES PATENTS

| | | |
|---|---|---|
| 2,701,326 | Pfann et al. | Feb. 1, 1955 |
| 2,725,315 | Fuller | Nov. 29, 1955 |
| 2,739,046 | Pfann | Mar. 20, 1956 |
| 2,739,088 | Pfann | Mar. 20, 1956 |
| 2,822,309 | Hall | Feb. 4, 1958 |
| 2,836,521 | Longini | May 27, 1958 |
| 2,840,497 | Longini | June 24, 1958 |

FOREIGN PATENTS

| | | |
|---|---|---|
| 751,408 | Great Britain | June 27, 1956 |
| 752,457 | Great Britain | July 11, 1956 |
| 1,113,385 | France | Dec. 5, 1955 |